US012740153B2

United States Patent

(12) United States Patent
Gonzalez et al.

(10) Patent No.: US 12,740,153 B2
(45) Date of Patent: Sep. 15, 2026

(54) INTERPOSER INCLUDING INDUCTOR DEVICES

(71) Applicant: QUALCOMM Incorporated, San Diego, CA (US)

(72) Inventors: Jason Gonzalez, Solana Beach, CA (US); Harvijaysinh Raj, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 459 days.

(21) Appl. No.: 18/534,169

(22) Filed: Dec. 8, 2023

(65) Prior Publication Data

US 2025/0194255 A1 Jun. 12, 2025

(51) Int. Cl.

| | |
|---|---|
| ***H10D 86/85*** | (2025.01) |
| ***H10D 84/01*** | (2025.01) |
| ***H10W 72/00*** | (2026.01) |
| ***H10W 90/00*** | (2026.01) |
| *H10W 20/20* | (2026.01) |
| *H10W 72/20* | (2026.01) |
| *H10W 72/90* | (2026.01) |

(52) U.S. Cl.

CPC ............. *H10D 86/85* (2025.01); *H10D 84/01* (2025.01); *H10W 72/00* (2026.01); *H10W 90/00* (2026.01); *H10W 20/20* (2026.01); *H10W 72/07254* (2026.01); *H10W 72/247* (2026.01); *H10W 72/90* (2026.01); *H10W 72/923* (2026.01); *H10W 72/9415* (2026.01); *H10W 72/942* (2026.01); *H10W 72/944* (2026.01); *H10W 90/722* (2026.01); *H10W 90/724* (2026.01)

(58) Field of Classification Search

None

See application file for complete search history.

(56) References Cited

U.S. PATENT DOCUMENTS

| | | | | |
|---|---|---|---|---|
| 11,201,127 | B2 * | 12/2021 | Kim .................... | H10W 70/611 |
| 11,764,171 | B2 * | 9/2023 | Yu ....................... | H10W 44/501 257/531 |
| 12,199,051 | B2 * | 1/2025 | Yu ....................... | H10W 44/501 |
| 2011/0291232 | A1 | 12/2011 | Yen et al. | |
| 2015/0035162 | A1 | 2/2015 | Lan et al. | |
| 2019/0164905 | A1 | 5/2019 | Hsieh et al. | |
| 2023/0369254 | A1 | 11/2023 | Yu et al. | |

OTHER PUBLICATIONS

International Search Report and Written Opinion—PCT/US2024/051961—ISA/EPO—Jan. 28, 2025.

* cited by examiner

*Primary Examiner* — Nicholas J Tobergte

(74) *Attorney, Agent, or Firm* — Muncy, Geissler, Olds & Lowe, P.C.

(57) ABSTRACT

In an aspect, an interposer includes a substrate, a first metallization layer on the substrate and having a first plurality of conductive patterns, a second metallization layer having a second plurality of conductive patterns, and a via layer disposed between the first metallization layer and the second metallization layer and having a plurality of vias. At least a portion of the first plurality of conductive patterns, a portion of the second plurality of conductive patterns, or both may be configured to form a first inductor device and a second inductor device. The first inductor device may be electrically coupled between a first power node and a second power node of the interposer. The second inductor device may be electrically coupled between the first power node and a third power node of the interposer.

20 Claims, 8 Drawing Sheets

INTERPOSER INCLUDING INDUCTOR DEVICES

TECHNICAL FIELD

The present disclosure generally relates to an interposer, and, more particularly, to an interposer that is for an integrated circuit (IC) package and includes inductor devices coupled between two power nodes of the interposer.

BACKGROUND

IC technology has achieved great strides in advancing computing power through miniaturization of electronic components. An IC chip or an IC die may include a set of circuits integrated thereon. In some implementations, an IC device may be formed by incorporating and protecting one or more IC dies in an IC package, where various power and signal nodes of the one or more IC dies can be electrically coupled to respective conductive terminals of the IC package via electrical paths formed in one or more package substrates of the IC package. The term "substrate" in this disclosure, unless otherwise specified, refers to a packaging substrate for packaging one or more IC dies, which is different from the semiconductor substrate for forming an IC die.

Various packaging technologies can be found in many electronic devices, including processors, servers, radio frequency (RF) ICs, etc. Advanced packaging and processing techniques allow for complex devices, such as multi-die devices and system on a chip (SOC) devices, which may include multiple function blocks, with each function block designed to perform a specific function, such as, for example, a microprocessor function, a graphics processing unit (GPU) function, a communications function (e.g., Wi-Fi, Bluetooth, and/or other communications), and the like.

For example, an interposer may be used in an IC package, where one or more IC dies may be mounted on the interposer, and the interposer may be further mounted on another IC die, based on a three-dimensional IC (3DIC) packaging scheme. The IC package may be further mounted on a circuit board (e.g., a printed circuit board, or known as a PCB). In some examples, a power management integrated circuit (PMIC) (e.g., in the form of another IC package) may be mounted on the PCB and configured to manage one or more power distribution networks (PDNs) for supplying power to the IC dies in the IC package.

In some examples, multiple circuit blocks in an IC die may share the same PDN. In some examples, multiple circuit blocks on a single PDN may have design performance issues or risks, such as the power supply noises caused by switching noises from one circuit block may be coupled to another circuit block through the shared PDN, which may reduce the speed and signal integrity of the circuit blocks (affecting analog circuits as well as digital circuits). Furthermore, as the industry moves to packaging IC dies based on 3DIC packaging, there may be an increased need for power sharing as circuit densities increase.

Accordingly, there may be a need to design a shared PDN that meets power specifications for the circuit blocks on the shared PDN, such that the circuit blocks may share sensitive power supplies while having necessary noise isolation from one other.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, an interposer includes a substrate; a first metallization layer on the substrate, the first metallization layer having a first plurality of conductive patterns; a second metallization layer having a second plurality of conductive patterns; and a via layer disposed between the first metallization layer and the second metallization layer, the via layer having a plurality of vias, wherein: at least a portion of the first plurality of conductive patterns, a portion of the second plurality of conductive patterns, or both are configured to form a first inductor device and a second inductor device, the first inductor device is electrically coupled between a first power node and a second power node of the interposer, and the second inductor device is electrically coupled between the first power node and a third power node of the interposer.

In an aspect, a method of manufacturing an interposer includes forming a first metallization layer on a substrate, the first metallization layer having a first plurality of conductive patterns; forming a second metallization layer having a second plurality of conductive patterns; and forming a via layer disposed between the first metallization layer and the second metallization layer, the via layer having a plurality of vias, wherein: at least a portion of the first plurality of conductive patterns, a portion of the second plurality of conductive patterns, or both are configured to form a first inductor device and a second inductor device, the first inductor device is electrically coupled between a first power node and a second power node of the interposer, and the second inductor device is electrically coupled between the first power node and a third power node of the interposer.

In an aspect, an integrated circuit (IC) package includes an interposer comprising: a substrate; a first metallization layer on the substrate, the first metallization layer having a first plurality of conductive patterns; a second metallization layer having a second plurality of conductive patterns; and a via layer disposed between the first metallization layer and the second metallization layer, the via layer having a plurality of vias, a first IC die mounted on the interposer, the first IC die including a first circuit block and a second circuit block, wherein at least a portion of the first plurality of conductive patterns, a portion of the second plurality of conductive patterns, or both are configured to form a first inductor device and a second inductor device, the first inductor device is electrically coupled between a first power node and a second power node of the interposer, the second inductor device is electrically coupled between the first power node and a third power node of the interposer, the first circuit block includes a first power terminal electrically coupled to the second power node of the interposer, and the second circuit block includes a second power node electrically coupled to the third power node of the interposer.

In an aspect, an electronic device includes an integrated circuit (IC) package that comprises: an interposer comprising: a substrate; a first metallization layer on the substrate, the first metallization layer having a first plurality of conductive patterns; a second metallization layer having a second plurality of conductive patterns; and a via layer disposed between the first metallization layer and the second metallization layer, the via layer having a plurality of vias, a first IC die mounted on the interposer, the first IC die including a first circuit block and a second circuit block, wherein at least a portion of the first plurality of conductive patterns, a portion of the second plurality of conductive patterns, or both are configured to form a first inductor device and a second inductor device, the first inductor device is electrically coupled between a first power node and a second power node of the interposer, the second inductor device is electrically coupled between the first power node and a third power node of the interposer, the first circuit block includes a first power terminal electrically coupled to the second power node of the interposer, and the second circuit block includes a second power node electrically coupled to the third power node of the interposer.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

Figure 1:
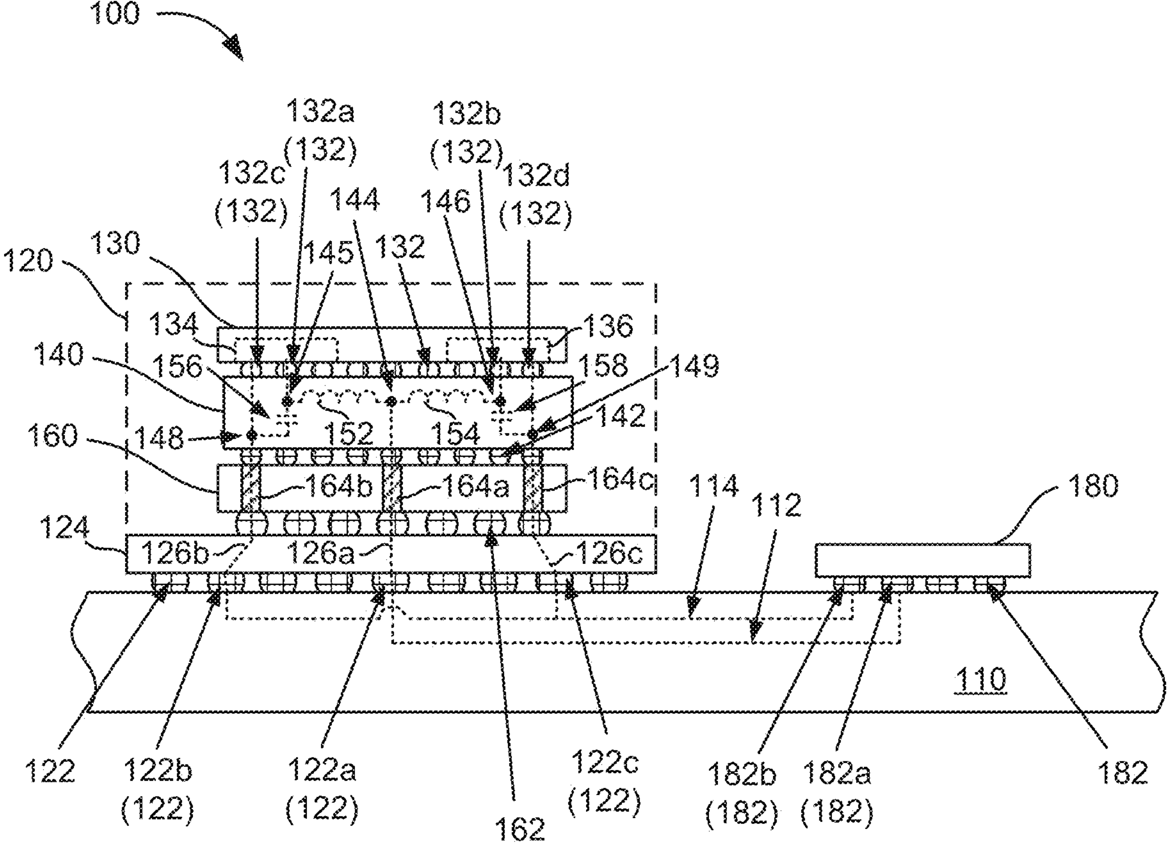
FIG. 1 is a cross-sectional view of a portion of a circuit board assembly, according to aspects of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

In certain described example implementations, instances are identified where various component structures and portions of operations can be taken from known, conventional techniques, and then arranged in accordance with one or more aspects. In such instances, internal details of the known, conventional component structures and/or portions of operations may be omitted to help avoid potential obfuscation of the concepts illustrated in the illustrative aspects disclosed herein.

The terminology used herein is for the purpose of describing particular aspects only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. Additionally, terms such as approximately, generally, and the like indicate that the examples provided are not intended to be limited to the precise numerical values or geometric shapes and include normal variations due to, manufacturing tolerances and variations, material variations, and other design considerations.

As noted in the foregoing, various aspects relate generally to manufacturing an interposer that includes embedded inductor devices coupled between two power nodes for a same electric potential in a shared power distribution network (PDN). In some aspects, the interposer may further include embedded inductor devices between power nodes for different electric potentials in the shared PDN.

Particular aspects of the subject matter described in this disclosure can be implemented to realize one or more of the following potential advantages. In some examples, the switching noises coupled to a power node in the shared PDN from one circuit block may be blocked by the embedded inductor devices without affecting another power node for the same electric potential in the shared PDN. In some examples, the embedded capacitor devices may increase the stability of the voltage levels at the power nodes for different electric potentials in the shared PDN for different circuit blocks.

FIG. 1 is a cross-sectional view of a portion of a circuit board assembly 100, according to aspects of the disclosure. In some aspects, FIG. 1 is a simplified cross-sectional view of the circuit board assembly 100, and certain details and components of the circuit board assembly 100 may be simplified or omitted in FIG. 1.

As shown in FIG. 1, the circuit board assembly 100 may include a printed circuit board (PCB) 110, an IC package 120 mounted on the PCB 110, and a power management integrated circuit (PMIC) (in the form of another IC package) 180 mounted on the PCB 110. In some aspects, the PCB 110 may include layers of conductive patterns formed therein (not shown). In some aspects, the IC package 120 may be mounted on the PCB 110 through terminal structures 122 (e.g., solder bumps based on a controlled collapse of chip connection (C4) mounting method, also referred to as C4 bumps). In some aspects, the PMIC 180 may be mounted on the PCB 110 through terminal structures 182 (e.g., C4 bumps).

In some aspects, the IC package 120 may include a package substrate 124, a first IC die 130, an interposer 140, and a second IC die 180. In some aspects, the first IC die 130 may be mounted on the interposer 140 through terminal structures 132 (e.g., solder bumps our copper pillar bumps). In some aspects, the interposer 140 may be mounted on the second IC die 160 through terminal structures 142 (e.g., solder bumps our copper pillar bumps). In some aspects, the second IC die 160 may be mounted on the package substrate 124 through terminal structures 162 (e.g., solder bumps our copper pillar bumps).

In some aspects, the first IC die 130 may include a first circuit block 134 and a second circuit block 136. In some aspects, the first circuit block 134 and the second circuit block 136 may each be configured based on a respective intellectual property (IP) circuit block. In some aspects, the first circuit block 134 and/or the second circuit block 136 may include one or more analog circuit blocks, one or more digital circuit blocks, and/or one or more mixed-mode circuit blocks.

In some aspects, the interposer 140 may include conductive patterns (not shown) configured to define at least power nodes 144, 145, 146, 148, and 149. In some aspects, the interposer 140 may include conductive patterns (not shown) configured to form a first inductor device 152 and a second inductor device 154. In some aspects, the first inductor device 152 may be electrically coupled between the power node 144 and the power node 145 of the interposer 140. In some aspects, the second inductor device 154 may be electrically coupled between the power node 144 and the power node 146 of the interposer 140. In some aspects, the first circuit block 134 may include a first power terminal (e.g., represented by the terminal structure 132*a* of the terminal structures 132) electrically coupled to the power node 145 of the interposer 140. In some aspects, the second circuit block 136 may have a second power terminal (e.g., represented by the terminal structure 132*b* of the terminal structures 132) electrically coupled to the power node 146 of the interposer 140.

In some aspects, the interposer 140 may further include a first capacitor device 156 and a second capacitor device 158. In some aspects, the first capacitor device 156 may be electrically coupled between the power node 145 and the power node 148 of the interposer 140. In some aspects, the second capacitor device 158 may be electrically coupled between the power node 146 and the power node 149 of the interposer 140. In some aspects, the first circuit block 134 may include a third power terminal (e.g., represented by the terminal structure 132*c* of the terminal structures 132) electrically coupled to the power node 148 of the interposer 140. In some aspects, the second circuit block 136 may have a fourth power terminal (e.g., represented by the terminal structure 132*d* of the terminal structures 132) electrically coupled to the power node 149 of the interposer 140.

In some aspects, the second die 160 may include through-substrate vias (TSVs) 164*a*, 164*b*, and 164*c* that are electrically coupled to the power node 144, the power node 148, and the power node 149 through respective ones of the terminal structures 142.

In some aspects, the PMIC 180 may be configured to supply a first supply voltage at the terminal structure 182*a* of the terminal structures 182. The power node 144 may be electrically coupled to the terminal structure 182*a* through a conductive path 112 formed by various conductive patterns in the PCB 110, a terminal structure 122*a* of the terminal structures 122, a conductive path 126*a* formed by various conductive patterns in the package substrate 124, a terminal structure (e.g., the terminal structure 162*a* in FIG. 2) of the terminal structures 162, the TSV 164*a*, and a terminal structure (e.g., the terminal structure 142*a* in FIG. 2) of the terminal structures 142. Accordingly, the power node 144 may be configured to carry the first supply voltage from the PMIC 180. In some aspects, the power node 144, the power node 145, and the power node 146 may be configured for a same direct current (DC) electric potential.

In some aspects, the PMIC 180 may be configured to supply a second supply voltage different from the first voltage, or to supply a ground voltage, at the terminal structure 182*b* of the terminal structures 182. The power node 148 may be electrically coupled to the terminal structure 182*b* through a conductive path 114 formed by various conductive patterns in the PCB 110, a terminal structure 122*b* of the terminal structures 122, a conductive path 126*b* formed by various conductive patterns in the package substrate 124, a terminal structure (e.g., the terminal structure 162*b* in FIG. 2) of the terminal structures 162, the TSV 164*b*, and a terminal structure (e.g., the terminal structure 142*b* in FIG. 2) of the terminal structures 142. The power node 149 may be electrically coupled to the terminal structure 182*b* through the conductive path 114 of the PCB 110, a terminal structure 122*c* of the terminal structures 122, a conductive path 126*c* formed by various conductive patterns in the package substrate 124, a terminal structure (e.g., the terminal structure 162*c* in FIG. 2) of the terminal structures 162, the TSV 164*c*, and a terminal structure (e.g., the terminal structure 142*c* in FIG. 2) of the terminal structures 142. Accordingly, the power node 148 and the power node 149 may be configured to carry the second supply voltage or the ground voltage from the PMIC 180.

In some aspects, the second supply voltage may be lower than the first supply voltage. In some aspects, the ground voltage may be lower than the first supply voltage.

Figure 2:
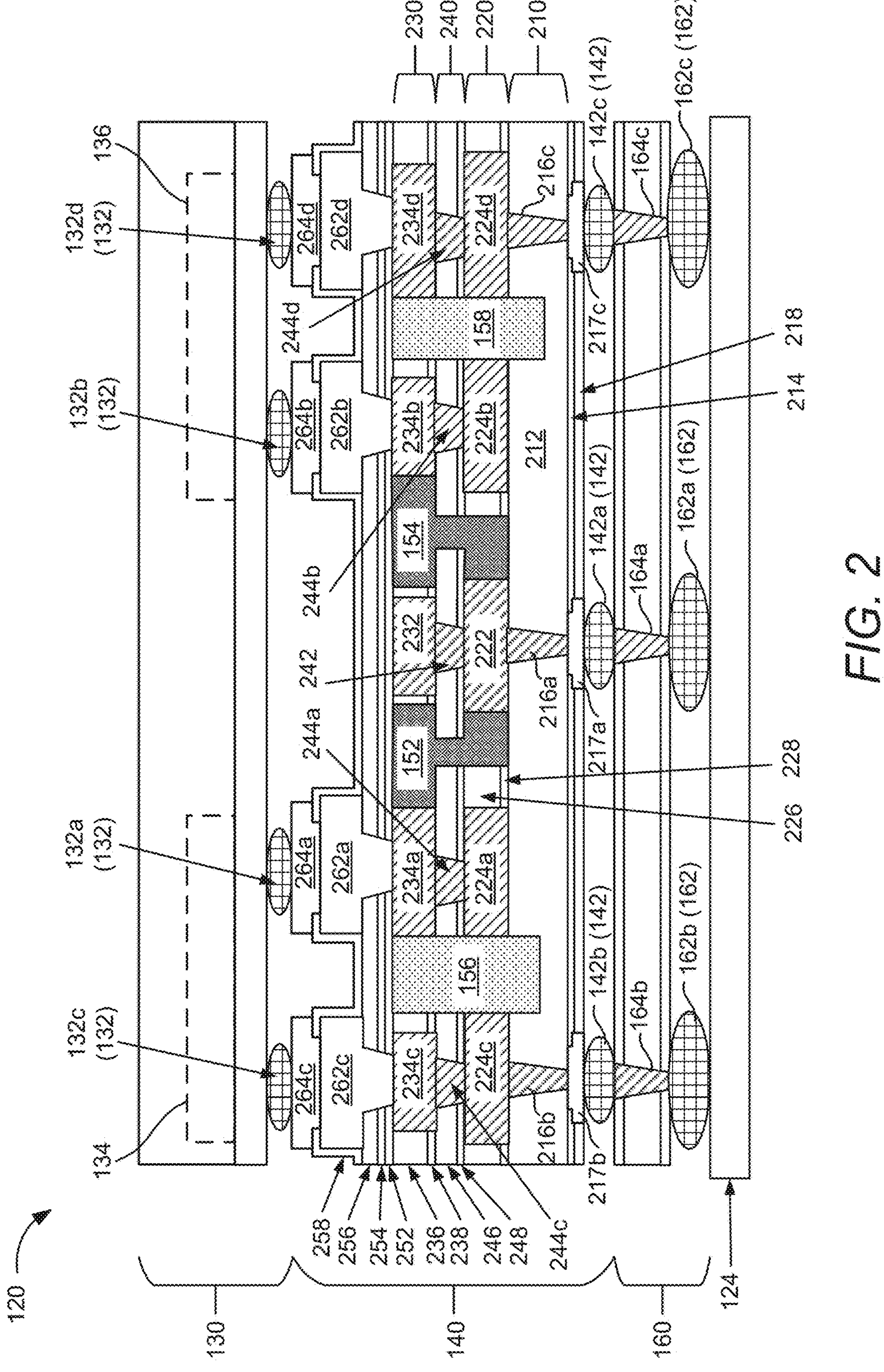
FIG. 2 is a cross-sectional view of a portion of an integrated circuit (IC) package, according to aspects of the disclosure.

FIG. 2 is a cross-sectional view of a portion of an IC package, such as the IC package 120 in FIG. 1, according to aspects of the disclosure. The components in FIG. 2 that are the same or similar to those in FIG. 1 are given the same reference numbers, and detail description thereof may be simplified or omitted.

As shown in FIG. 2, the interposer 140 may include a substrate 210, a first metallization layer 220 on the substrate 210, a second metallization layer 230, and a via layer 240 disposed between the first metallization layer 220 and the second metallization layer 230. In some aspects, the substrate 210 may include a dielectric layer 212 and TSVs 216*a*, 216*b*, and 216*c* extending through the dielectric layer 212. In some aspects, the substrate 210 may include an etch stop layer 214 under the dielectric layer 212, and may include conductive pads 217*a*, 217*b*, and 217*c* connected to the TSVs 216*a*, 216*b*, and 216*c*. In some aspects, the substrate 210 may further include a passivation layer 218 under the etch stop layer 214 and surrounding the conductive pads 217*a*, 217*b*, and 217*c*. In some aspects, the conductive pads 217*a*, 217*b*, and 217*c* may be connected to the terminal structures 142*a*, 142*b*, and 142*c*.

In some aspects, the first metallization layer 220 may include first plurality of conductive patterns that include conductive patterns 222, 224*a*, 224*b*, 224*c*, and 224*d*. In some aspects, the first metallization layer 220 may include an interlayer dielectric layer 226 surrounding the first plurality of conductive patterns, and an etch stop layer 228 under the interlayer dielectric layer 226. In some aspects, the second metallization layer 230 may include second plurality of conductive patterns that include conductive patterns 232, 234*a*, 234*b*, 234*c*, and 234*d*. In some aspects, the second metallization layer 230 may include an interlayer dielectric layer 236 surrounding the second plurality of conductive patterns, and an etch stop layer 238 under the interlayer dielectric layer 236. Moreover, in some aspects, the via layer 240 may include a plurality of vias 242, 244*a*, 244*b*, 244*c*, and 244*d*. In some aspects, the via layer 240 may include an interlayer dielectric layer 246 surrounding the plurality of vias, and an etch stop layer 248 under the interlayer dielectric layer 246.

In some aspects, the interposer 140 may further include an etch stop layer 252 on the second metallization layer 230, a passivation layer 254 on the etch stop layer 252, and a dielectric layer 256 on the passivation layer 254. In some aspects, the interposer 140 may include under bump metallization structures 262*a*, 262*b*, 262*c*, and 262*d* through the etch stop layer 252, the passivation layer 254, and the dielectric layer 256, and connected to the conductive patterns 234*a*, 234*b*, 234*c*, and 234*d*, respectively. Moreover, another passivation layer 258 may be disposed on the dielectric layer 256 and partially covering the under bump metallization structures 262*a*, 262*b*, 262*c*, and 262*d*. Also, the interposer 140 may include conductive pads 264*a*, 264*b*, 264*c*, and 264*d* on and connected to the under bump metallization structures 262*a*, 262*b*, 262*c*, and 262*d*. In some aspects, the conductive pads 264*a*, 264*b*, 264*c*, and 264*d* may be connected to the terminal structures 132*a*, 132*b*, 132*c*, and 132*d*.

In some aspects, the dielectric layers 212, 226, 246, and 256 may include silicon dioxide (SiO2), tetraethyl orthosilicate (TEOS), or fluorinated tetraethyl orthosilicate (FTEOS). In some aspects, the etch stop layers 214, 228, 248, and 252 may include silicon nitride (SiN). In some aspects, the passivation layers 218, 254, and 258 may include polyimide.

In some aspects, the conductive pads 217*a*, the TSV 216*a*, the conductive pattern 222, the via 242, and the conductive pattern 232 may constitute a set of conductive structures electrically coupled together and may correspond to the power node 144 in FIG. 1. In some aspects, the conductive pattern 224*a*, the via 244*a*, the conductive pattern 234*a*, the under bump metallization structure 262*a*, and the conductive pad 264*a* may constitute a set of conductive structures electrically coupled together and may correspond to the power node 145 in FIG. 1. In some aspects, the conductive pattern 224*b*, the via 244*b*, the conductive pattern 234*b*, the under bump metallization structure 262*b*, and the conductive pad 264*b* may constitute a set of conductive structures electrically coupled together and may correspond to the power node 146 in FIG. 1.

In some aspects, the conductive pads 217*b*, the TSV 216*b*, the conductive pattern 224*c*, the via 244*c*, the conductive pattern 234*c*, the under bump metallization structure 262*c*, and the conductive pad 264*c* may constitute a set of conductive structures electrically coupled together and may correspond to the power node 148 in FIG. 1. In some aspects, the conductive pads 217*c*, the TSV 216*c*, the conductive pattern 224*d*, the via 244*d*, the conductive pattern 234*d*, the under bump metallization structure 262*d*, and the conductive pad 264*d* may constitute a set of conductive structures electrically coupled together and may correspond to the power node 149 in FIG. 1.

Moreover, as shown in FIG. 2 in view of FIG. 1, at least a portion of the plurality of conductive patterns of the first metallization layer 220, a portion of the plurality of conductive patterns of the second metallization layer 230, or both, may be configured to form a first inductor device 152 and a second inductor device 154. In some aspects, the first inductor device 152 may be electrically coupled between the power node 144 and the power node 145 of the interposer 140. In some aspects, the second inductor device 154 may be electrically coupled between the power node 144 and the power node 146 of the interposer 140.

In some aspects, the first inductor device 152 may be a spiral structure formed in the first metallization layer 220 or the second metallization layer 230. In some aspects, the first inductor device 152 may be a first solenoid structure formed in the first metallization layer 220, the via layer 240, and the second metallization layer 230, where the first solenoid structure may have respective conductive patterns in the first metallization layer, respective vias in the via layer, and respective conductive patterns in the second metallization layer connected as a coil winding of the first solenoid structure. In some aspects, the second inductor device 154 may be a second spiral structure formed in the first metallization layer 220 or the second metallization layer 230. In some aspects, the second inductor device 154 may be a second solenoid structure formed in the first metallization layer 220, the via layer 240, and the second metallization layer 230, where the second solenoid structure may have respective conductive patterns in the first metallization layer, respective vias in the via layer, and respective conductive patterns in the second metallization layer connected as a coil winding of the second solenoid structure.

In some aspects, the structure and the manufacturing method of the first spiral structure, the second spiral structure, the first solenoid structure, and/or the second solenoid structure are described in this disclosure as non-limiting examples and may be any suitable structure and/or method known in the field of semiconductor manufacturing.

In some aspects, each of the inductor devices 152 and 154 may be a two-metal-stack spiral inductor with a center tap, with a size of 60 micrometers (μm)×60 μm. In some aspects, each of the inductor devices 152 and 154 according to such example structure may have an inductance value of 100 pH (or 200 pH between power nodes 145 and 146 as the two inductor devices 152 and 154 are connected in series).

Also, as shown in FIG. 2 in view of FIG. 1, the interposer 140 may include a first capacitor device 156 and a second capacitor device 158 formed in the substrate 210, the first metallization layer 220, the via layer 240, the second metallization layer 230, or a combination thereof. In some aspects, the first capacitor device 156 may be electrically coupled between the power node 145 and the power node 148 of the interposer 140. In some aspects, the second capacitor device 158 may be electrically coupled between the power node 146 and the power node 149 of the interposer 140.

In some aspects, the first capacitor device 156 may be a first metal-insulator-metal structure formed in the first metallization layer 220 and the via layer 240. In some aspects, the first capacitor device 156 may be a first metal-oxide-metal structure formed in the first metallization layer 220, the second metallization layer 230, or both. In some aspects, the first capacitor device 156 may be a first deep trench capacitor structure formed in the first metallization layer 220 and the substrate 210. In some aspects, the second capacitor device 158 may be a second metal-insulator-metal structure formed in the first metallization layer 220 and the via layer 240. In some aspects, the second capacitor device 158 may be a second metal-oxide-metal structure formed in the first metallization layer 220, the second metallization layer 230, or both. In some aspects, the second capacitor device 158 may be a second deep trench capacitor structure formed in the first metallization layer 220 and the substrate 210. In some aspects, the structure and the manufacturing method of the first metal-oxide-metal structure, the second metal-oxide-metal structure, of the first metal-insulator-metal structure, the second metal-insulator-metal structure, the first deep trench capacitor structure, and/or the second deep trench capacitor structure are described in this disclosure as non-limiting examples, and may be any suitable structure and/or method known in the field of semiconductor manufacturing.

Accordingly, as shown in FIGS. 1 and 2, an interposer 140 between two IC dies 130 and 160 may increase the stability of the voltage levels of the power supply voltages (for different electric potentials) to different circuit blocks by including embedded capacitor devices (e.g., the capacitor devices 156 and 158), as well as to isolate the switching noises among different circuit blocks by including embedded inductor devices (e.g., the inductor devices 152 and 154). For example, the switching noises of the circuit block 134 coupled to the power node 145 may be stopped or filtered by the inductor devices 152 and 154, and thus may not affect the power node 146 (that is configured to provide the first supply voltage to the circuit block 136 or configured for the same electric potential).

FIGS. 3A-3E illustrate structures at various stages of manufacturing an interposer, such as the interposer 140 in FIGS. 1 and 2, according to aspects of the disclosure. The components illustrated in FIGS. 3A-3E that are the same or similar to those of FIGS. 1 and 2 are given the same reference numbers, and the detailed description thereof may be omitted.

Figures 3A, 3B:
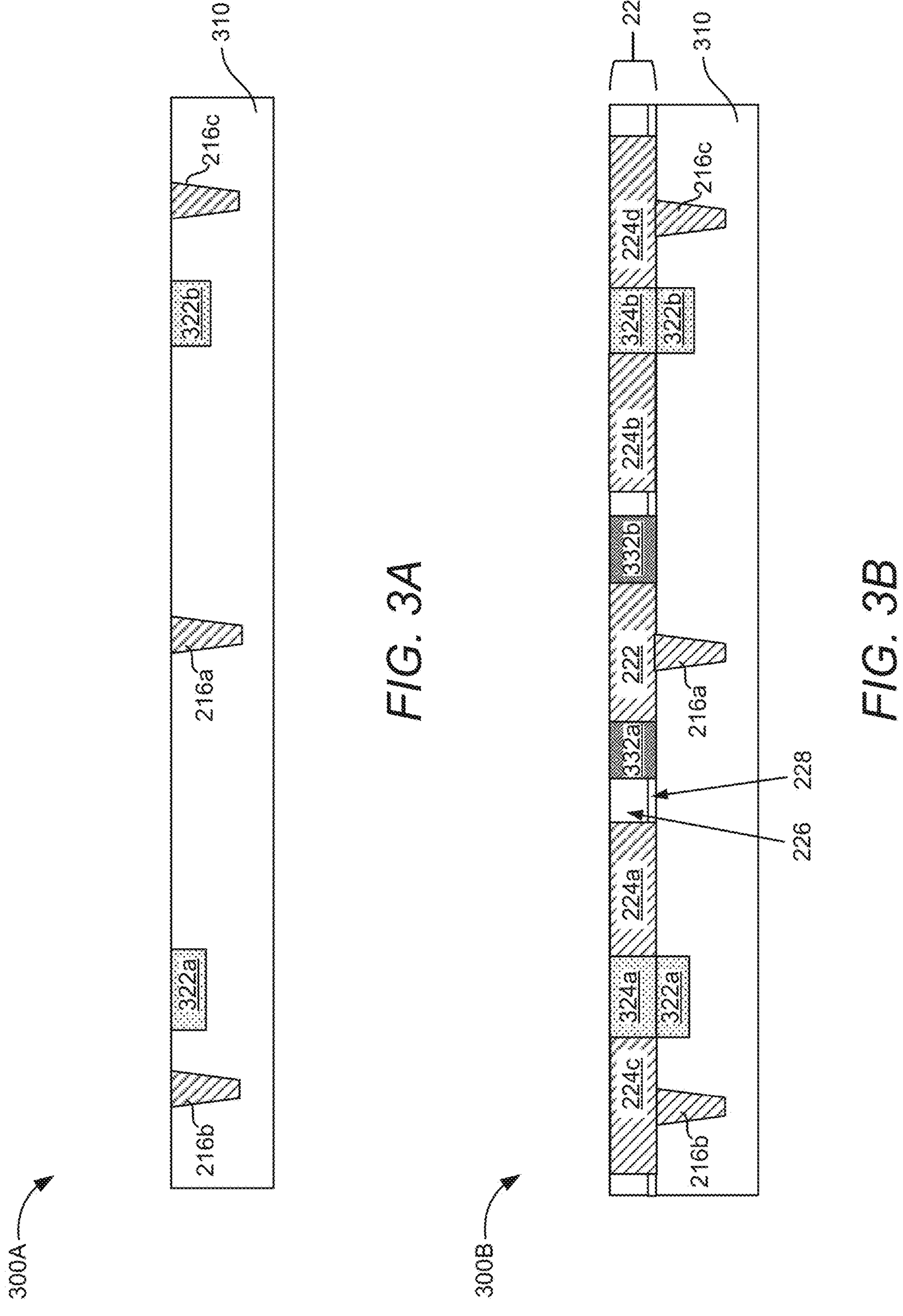
FIGS. 3A-3E illustrate structures at various stages of manufacturing an interposer, according to aspects of the disclosure.

As shown in FIG. 3A, a structure 300A may be formed by forming TSVs 216*a*, 216*b*, and 216*c* in a substrate 310. At this stage, the TSVs 216*a*, 216*b*, and 216*c* are not yet completely through the substrate 310. In some aspects, the lower portion of the substrate 310 may be removed to expose the lower surfaces of the TSVs 216*a*, 216*b*, and 216*c* (e.g., FIG. 3E). In some aspects, the TSVs 216*a*, 216*b*, and 216*c* may be formed by first forming openings in the substrate 310 and then filling the openings with a conductive material (e.g., copper, aluminum, tungsten, or a combination thereof).

Moreover, the structure 300A may be formed further by wholly or partially forming the first capacitor device 156 (e.g., portion 322*a*) and the second capacitor device 158 (e.g., portion 322*b*). In some aspects, the first capacitor device 156 and the second capacitor device 158 may include deep trench capacitor structures, and the portions 322*a* and 322*b* may be formed by forming trenches in the substrate 310, forming a first metal portion of each of the deep trench capacitor structures in the trenches and extending to an upper surface of the substrate 310, forming an insulator portion of each of the deep trench capacitor structures in the trenches and on the respective first metal portion, and/or forming a second metal portion of each of the deep trench capacitor structures in the trenches and on the insulator portion. In some aspects, the first metal portion, the insulator portion, and the second metal portion are at least partially in the first metallization layer (e.g., the first metallization layer 220) and partially in the substrate.

In some aspects, the first capacitor device 156 and the second capacitor device 158 may include metal-oxide-metal structures or metal-insulator-metal structures, and portions 322*a* and 322*b* may not be formed.

As shown in FIG. 3B, a structure 300B may be formed based on the structure 300A by forming the first metallization layer 220 on the substrate 310. In some aspects, the first metallization layer 220 may be formed by first forming an etch stop layer 228 on the substrate 310, forming an interlayer dielectric layer 226 on the etch stop layer 228, etching the interlayer dielectric layer 226 and the etch stop layer 228 to define openings and filling the openings with a conductive material (e.g., copper, aluminum, tungsten, or a combination thereof) to form a first plurality of conductive patterns. In some aspects, the first plurality of conductive patterns may include conductive patterns 222, 224*a*, 224*b*, 224*c*, and 224*d*.

In some aspects, the structure 300B may include portion 324*a* of the first capacitor device 156 and portion 324*b* of the second capacitor device 158. In some aspects, the first capacitor device 156 and the second capacitor device 158 may include deep trench capacitor structures, and the portions 324*a* and 324*b* may be extension of the portions 322*a* and 322*b* as described above.

In some aspects, the first capacitor device 156 and the second capacitor device 158 may include metal-insulator-metal structures, and the portions 324*a* and 324*b* may be formed by forming a first metal portion of each of the metal-insulator-metal structures. In some aspects, the first capacitor device 156 and the second capacitor device 158 may include metal-oxide-metal structures formed in the first metallization layer 220, and the portions 324*a* and 324*b* may be formed by forming a first metal portion and a second metal portion of each of the metal-oxide-metal structures, with an insulator portion of each of the metal-oxide-metal structures separating the respective first metal portion and the respective second metal portion.

In some aspects, the first capacitor device 156 and the second capacitor device 158 may include metal-oxide-metal structures formed in a metallization layer other than the first metallization layer 220, and portions 322*a* and 322*b* may not be formed.

In some aspects, the structure 300B may further include portion 332*a* of the first inductor device 152 and portion 332*b* of the second inductor device 154. In some aspects, the first inductor device 152 and the second inductor device 154 may include conductive patterns in the portions 332*a* and 332*b* configured as respective spiral structures in the first metallization layer 220. In some aspects, the first inductor device 152 and the second inductor device 154 may include solenoid structures, and the portions 332*a* and 332*b* may include conductive patterns configured as first lateral winding segments of the coil windings of the respective solenoid structures.

Figures 3C, 3D:
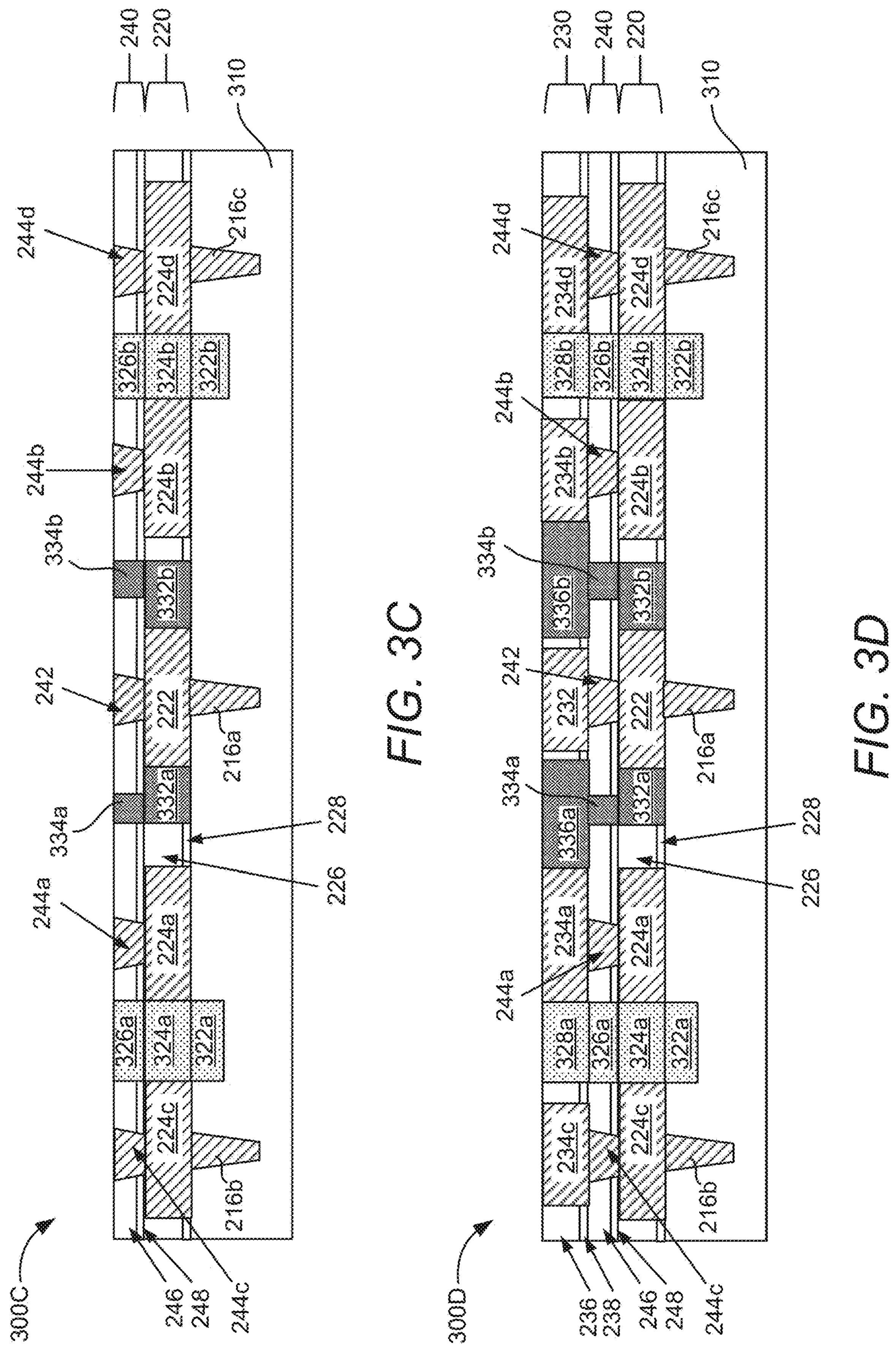

As shown in FIG. 3C, a structure 300C may be formed based on the structure 300C by forming the via layer 240 on the first metallization layer 220. In some aspects, the via layer 240 may be formed by first forming an etch stop layer 248 on the first metallization layer 220, forming an interlayer dielectric layer 246 on the etch stop layer 248, etching the interlayer dielectric layer 246 and the etch stop layer 248 to define openings, and filling the openings with a conductive material (e.g., copper, aluminum, tungsten, or a combination thereof) to form a plurality of vias. In some aspects, the plurality of vias may include vias 242, 244*a*, 244*b*, 244*c*, and 244*d*.

In some aspects, the structure 300C may include portion 326*a* of the first capacitor device 156 and portion 326*b* of the second capacitor device 158. In some aspects, the first capacitor device 156 and the second capacitor device 158 may include deep trench capacitor structures, and the portions 326*a* and 326*b* may not be formed.

In some aspects, the first capacitor device 156 and the second capacitor device 158 may include metal-insulator-metal structures, and the portions 326*a* and 326*b* may be formed by forming an insulator portion of each of the metal-insulator-metal structures on the respective first metal portion and forming a second metal portion on the respective insulator portion. In some aspects, the first capacitor device 156 and the second capacitor device 158 may include metal-oxide-metal structures formed in the first metallization layer 220 or in another metallization layer, and the portions 326*a* and 326*b* may include vias for electrically connecting the respective metal-oxide-metal structures.

In some aspects, the structure 300C may further include portion 334*a* of the first inductor device 152 and portion 334*b* of the second inductor device 154. In some aspects, the first inductor device 152 and the second inductor device 154 may include conductive patterns configured as respective spiral structures in the first metallization layer 220 or in another metallization layer, and the portions 334*a* and 334*b* may include vias for electrically connecting the respective spiral structures. In some aspects, the first inductor device 152 and the second inductor device 154 may include solenoid structures, and the portions 334*a* and 334*b* may include conductive patterns configured as vertical winding segments of the coil windings of the respective solenoid structures.

As shown in FIG. 3D, a structure 300D may be formed based on the structure 300C by forming the second metallization layer 230 on the via layer 240. In some aspects, the second metallization layer 230 may be formed by first forming an etch stop layer 238 on the via layer 240, forming an interlayer dielectric layer 236 on the etch stop layer 238, etching the interlayer dielectric layer 236 and the etch stop layer 238 to define openings, and filling the openings with a conductive material (e.g., copper, aluminum, tungsten, or a combination thereof) to form a second plurality of conductive patterns. In some aspects, the second plurality of conductive patterns may include conductive patterns 232, 234*a*, 234*b*, 234*c*, and 234*d*.

In some aspects, the structure 300D may include portion 328*a* of the first capacitor device 156 and portion 328*b* of the second capacitor device 158. In some aspects, the first capacitor device 156 and the second capacitor device 158 may include deep trench capacitor structures or metal-insulator-metal structures, and the portions 328*a* and 328*b* may be omitted.

In some aspects, the first capacitor device 156 and the second capacitor device 158 may include metal-oxide-metal structures formed in the second metallization layer 230, and the portions 328*a* and 328*b* may be formed by forming a first metal portion of each of the metal-oxide-metal structures, a second metal portion of each of the metal-oxide-metal structures, and an insulator portion separating the respective first metal portion and the respective second metal portion.

In some aspects, the first capacitor device 156 and the second capacitor device 158 may include metal-oxide-metal structures formed in a metallization layer other than the second metallization layer 230, and portions 328*a* and 328*b* may not be formed.

In some aspects, the structure 300D may further include portion 336*a* of the first inductor device 152 and portion 336*b* of the second inductor device 154. In some aspects, the first inductor device 152 and the second inductor device 154 may include conductive patterns in the portions 336*a* and 336*b* configured as respective spiral structures in the second metallization layer 230. In some aspects, the first inductor device 152 and the second inductor device 154 may include solenoid structures, and the portions 336*a* and 336*b* may include conductive patterns configured as second lateral winding segments of the coil windings of the respective solenoid structures.

Figure 3E:
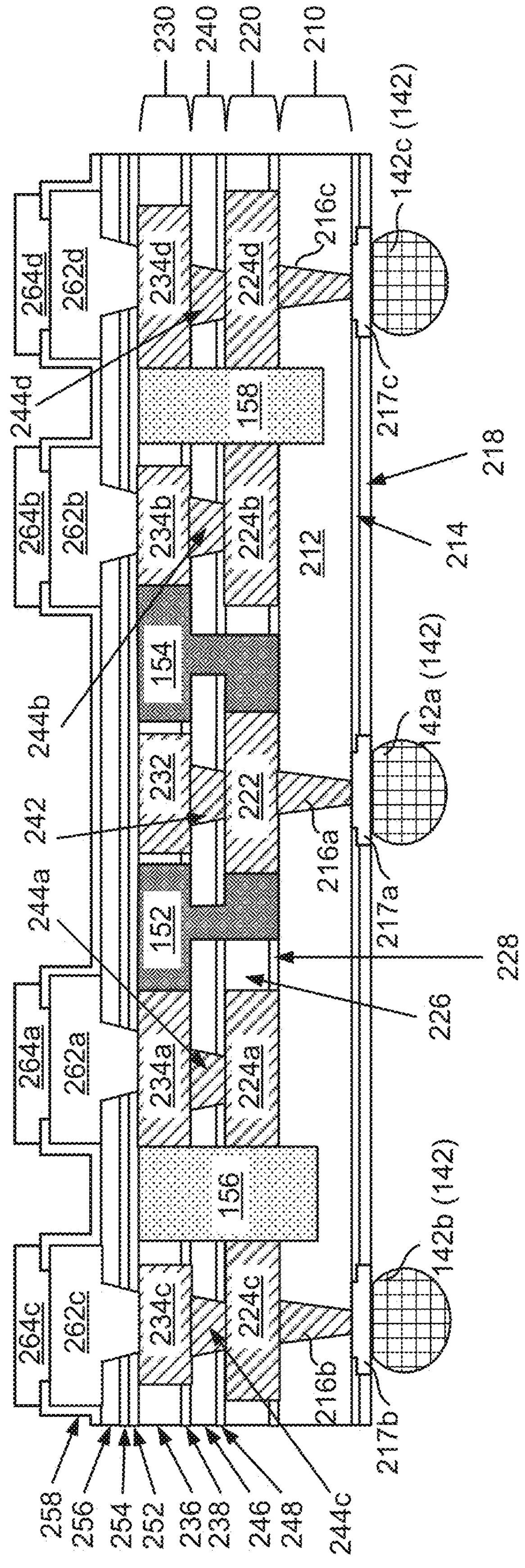

As shown in FIG. 3E, a structure 300E that corresponds to the interposer 140 may be formed. In some aspects, the structure 300E may be formed based on the structure 300D by forming an etch stop layer 252 on the second metallization layer 230, a passivation layer 254 on the etch stop layer 252, and a dielectric layer 256 on the passivation layer 254. In some aspects, the structure 300E may be formed by forming openings in the etch stop layer 252 and the dielectric layer 256 and forming the under bump metallization structures 262*a*, 262*b*, 262*c*, and 262*d* in the opening and on the dielectric layer 256. In some aspects, the structure 300E may be formed further by forming another passivation layer 258 on the dielectric layer 256 and partially covering the under bump metallization structures 262*a*, 262*b*, 262*c*, and 262*d*, and then forming the conductive pads 264*a*, 264*b*, 264*c*, and 264*d* on and connected to the under bump metallization structures 262*a*, 262*b*, 262*c*, and 262*d*.

Moreover, in some aspects, the structure 300E may be formed by removing the lower portion of the substrate 310 (thus becoming the substrate 210) to expose the lower surfaces of the TSVs 216*a*, 216*b*, and 216*c*. In some aspects, the structure 300E may be formed by forming the etch stop layer 214 under the dielectric layer 212, conductive pads 217*a*, 217*b*, and 217*c* connected to the TSVs 216*a*, 216*b*, and 216*c*, and the passivation layer 218 under the etch stop layer 214 and surrounding the conductive pads 217*a*, 217*b*, and 217*c*. In some aspects, the structure 300E may be formed further by forming the terminal structures 142*a*, 142*b*, and 142*c* (e.g., depicted in FIG. 3E as solder balls before the interposer 140 is mounted on the IC die 160) under the conductive pads 217*a*, 217*b*, and 217*c*.

Figure 4:
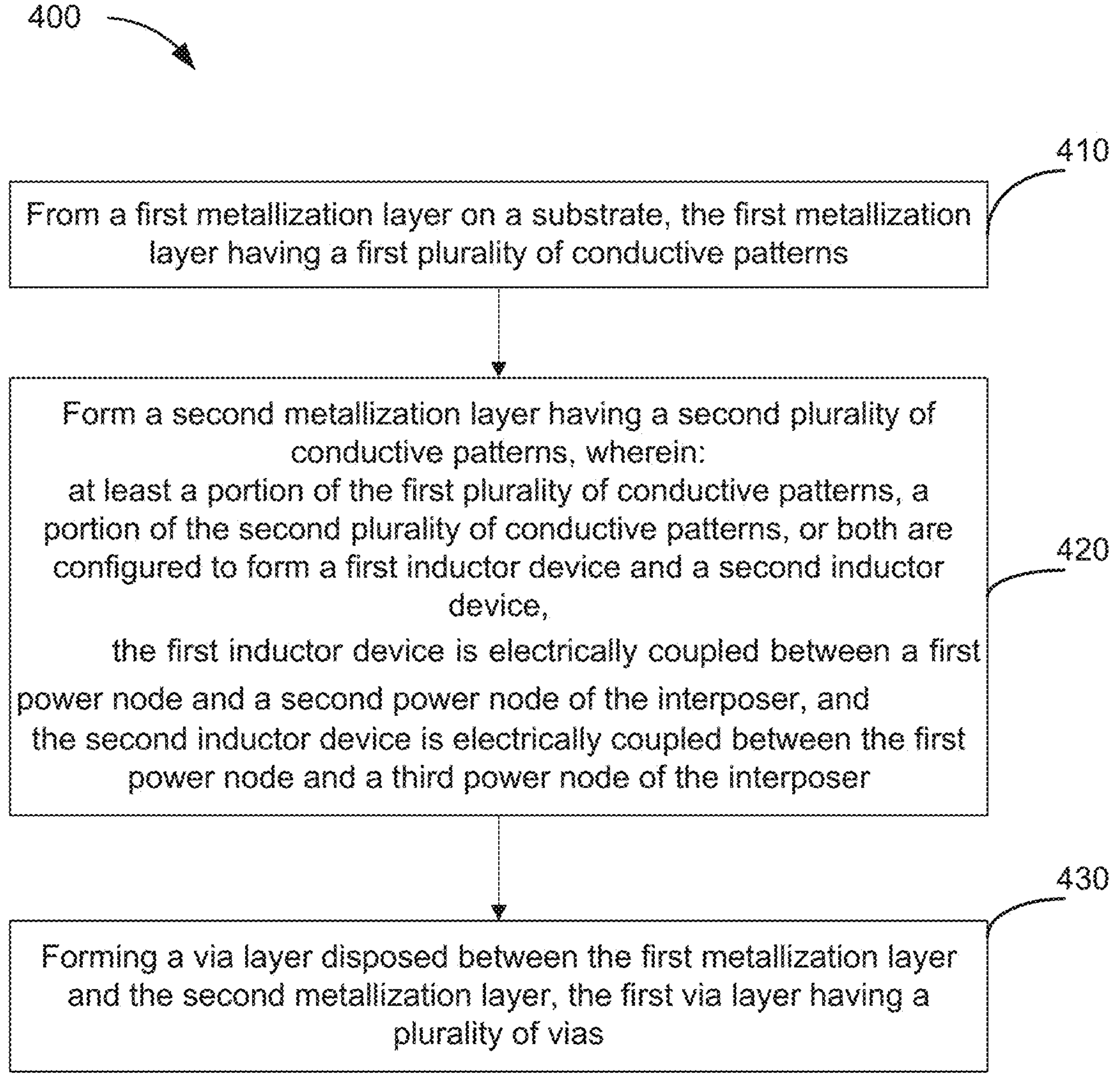
FIG. 4 illustrates a method for manufacturing the interposer, according to aspects of the disclosure.

FIG. 4 illustrates a method 400 for manufacturing an interposer (such as the interposer 140 in FIGS. 1 and 2 and/or the structure 300E in FIG. 3E), according to aspects of the disclosure. In some aspects, FIGS. 3A-3E may depict the interposer at different stages of manufacturing according to the method 400.

At operation 410, a first metallization layer (e.g., the first metallization layer 220) may be formed on a substrate (e.g., the substrate 310 or the substrate 210 after the substrate 310 is trimmed). In some aspects, the first metallization layer may have a first plurality of conductive patterns (e.g., the conductive patterns 222, 224*a*, 224*b*, 224*c*, and 224*d*). In some aspects, prior to operation 410, portions of the first capacitor device 156 (e.g., portion 322*a*) and the second capacitor device 158 (portion 322*b*) may be formed together with the substrate 310. In some aspects, at operation 410, portions of the first capacitor device 156 (e.g., portion 324*a*) and the second capacitor device 158 (portion 324*b*) may be formed. In some aspects, at operation 410, portions of the first inductor device 152 (e.g., portion 332*a*) and the second inductor device 154 (portion 332*b*) may be formed.

At operation 420, a second metallization layer (e.g., the second metallization layer 230) may be formed. In some aspects, the second metallization layer may have a second plurality of conductive patterns (e.g., the conductive patterns 232, 234*a*, 234*b*, 234*c*, and 234*d*). In some aspects, at least a portion of the first plurality of conductive patterns, a portion of the second plurality of conductive patterns, or both, are configured to form a first inductor device (e.g., the first inductor device 152) and a second inductor device (e.g., the second inductor device 154). In some aspects, the first inductor device may be electrically coupled between a first power node (e.g., power node 144) and a second power node (e.g., power node 145) of the interposer. In some aspects, the second inductor device may be electrically coupled between the first power node (e.g., power node 144) and a third power node (e.g., power node 146) of the interposer.

In some aspects, at operation 420, portions of the first capacitor device 156 (e.g., portion 328*a*) and the second capacitor device 158 (portion 328*b*) may be formed. In some aspects, at operation 420, portions of the first inductor device 152 (e.g., portion 336*a*) and the second inductor device 154 (portion 336*b*) may be formed.

At operation 430, a via layer (e.g., the layer 240) may be disposed between the first metallization layer and the second metallization layer. In some aspects, the via layer may have a plurality of vias (e.g., the vias 242, 244*a*, 244*b*, 244*c*, and 244*d*). In some aspects, operation 430 may be performed after operation 410 but prior to operation 420. In some aspects, at operation 430, portions of the first capacitor device 156 (e.g., portion 326*a*) and the second capacitor device 158 (portion 326*b*) may be formed. In some aspects, at operation 430, portions of the first inductor device 152 (e.g., portion 334*a*) and the second inductor device 154 (portion 334*b*) may be formed.

In some aspects, the first capacitor device and the second capacitor device may be formed in the substrate, the first metallization layer, the via layer, the second metallization layer, or a combination thereof. In some aspects, the first capacitor device may be electrically coupled between the second power node (e.g., power node 145) and a fourth power node (e.g., power node 148) of the interposer. In some aspects, the second capacitor device may be electrically coupled between the third power node (e.g., power node 146) and a fifth power node (e.g., power node 149) of the interposer.

In some aspects, the first power node may be configured to carry a first supply voltage. In some aspects, the fourth power node and the fifth power node may be configured to carry a second supply voltage that is different from the first supply voltage or to carry a ground voltage. In some aspects, the first power node, the second power node, and the third power node may be configured for a same DC electric potential.

In some aspects, the first inductor device may include a first spiral structure formed in the first metallization layer or the second metallization layer. In some aspects, the first inductor device may include a first solenoid structure formed in the first metallization layer, the via layer, and the second metallization layer, where the first solenoid structure may have respective conductive patterns in the first metallization layer, respective vias in the via layer, and respective conductive patterns in the second metallization layer connected as a coil winding of the first solenoid structure. In some aspects, the second inductor device may include a second spiral structure formed in the first metallization layer or the second metallization layer. In some aspects, the second inductor device may include a second solenoid structure formed in the first metallization layer, the via layer, and the second metallization layer, where the second solenoid structure may have respective conductive patterns in the first metallization layer, respective vias in the via layer, and respective conductive patterns in the second metallization layer connected as a coil winding of the second solenoid structure.

In some aspects, the first capacitor device may include a first metal-insulator-metal structure formed in the first metallization layer and the via layer. In such scenario, the forming the first metallization layer may include forming a first metal portion of the first metal-insulator-metal structure, and the forming the via layer comprises forming an insulator portion of the first metal-insulator-metal structure on the first metal portion and forming a second metal portion on the insulator portion of the first metal-insulator-metal structure. In some aspects, the second capacitor device may include a second metal-insulator-metal structure formed in the first metallization layer and the via layer. In such scenario, the forming the first metallization layer may include forming a first metal portion of the second metal-insulator-metal structure, and the forming the via layer comprises forming an insulator portion of the second metal-insulator-metal structure on the first metal portion and forming a second metal portion on the insulator portion of the second metal-insulator-metal structure.

In some aspects, the first capacitor device may include a first metal-oxide-metal structure formed in the first metallization layer, the second metallization layer, or both. In such scenario according to some examples, the forming the first metallization layer may include forming a first metal portion of the first metal-oxide-metal structure, a second metal portion of the first metal-oxide-metal structure, and a first insulator portion separating the first metal portion and the second metal portion of the first metal-oxide-metal structure. In such scenario according to some examples, the forming the second metallization layer may include forming a third metal portion of the first metal-oxide-metal structure, a fourth metal portion of the first metal-oxide-metal structure, and a second insulator portion separating the third metal portion and the fourth metal portion of the first metal-oxide-metal structure.

In some aspects, the second capacitor device may include a second metal-oxide-metal structure formed in the first metallization layer, the second metallization layer, or both. In such scenario according to some examples, the forming the first metallization layer may include forming a first metal portion of the second metal-oxide-metal structure, a second metal portion of the second metal-oxide-metal structure, and a first insulator portion separating the first metal portion and the second metal portion of the second metal-oxide-metal structure. In such scenario according to some examples, the forming the second metallization layer may include forming a third metal portion of the second metal-oxide-metal structure, a fourth metal portion of the second metal-oxide-metal structure, and a second insulator portion separating the third metal portion and the fourth metal portion of the second metal-oxide-metal structure.

In some aspects, the first capacitor device may include a first deep trench capacitor structure formed in the first metallization layer and the substrate. In some aspects, the method 400 may further include forming first trenches in the substrate, forming a first metal portion of the first deep trench capacitor structure in the first trenches and extending to an upper surface of the substrate, forming an insulator portion of the first deep trench capacitor structure in the first trenches and on the first metal portion, and forming a second metal portion of the first deep trench capacitor structure in the first trenches and on the insulator portion. In some aspects, the first metal portion, the insulator portion, and the second metal portion of the first deep trench capacitor structure may be at least partially in the first metallization layer and partially in the substrate.

In some aspects, the second capacitor device may include a second deep trench capacitor structure formed in the first metallization layer and the substrate. In some aspects, the method 400 may further include forming second trenches in the substrate, forming a first metal portion of the second deep trench capacitor structure in the second trenches and extending to an upper surface of the substrate, forming an insulator portion of the second deep trench capacitor structure in the second trenches and on the first metal portion, and forming a second metal portion of the second deep trench capacitor structure in the second trenches and on the insulator portion. In some aspects, the first metal portion, the insulator portion, and the second metal portion of the second deep trench capacitor structure may be at least partially in the first metallization layer and partially in the substrate.

A technical advantage of the method 400 may correspond to manufacturing an interposer that includes embedded inductor devices coupled between two power nodes for a same electric potential in a shared PDN, such that the switching noises coupled to a power node of the shared PDN from one circuit block may be blocked by the embedded inductor devices without affecting another power node of the shared PDN. Another technical advantage of the method 400 may correspond to the interposer including embedded capacitor devices that may increase the stability of the voltage levels at the power nodes for different electrical potentials in the shared PDN for different circuit blocks.

Figure 5:
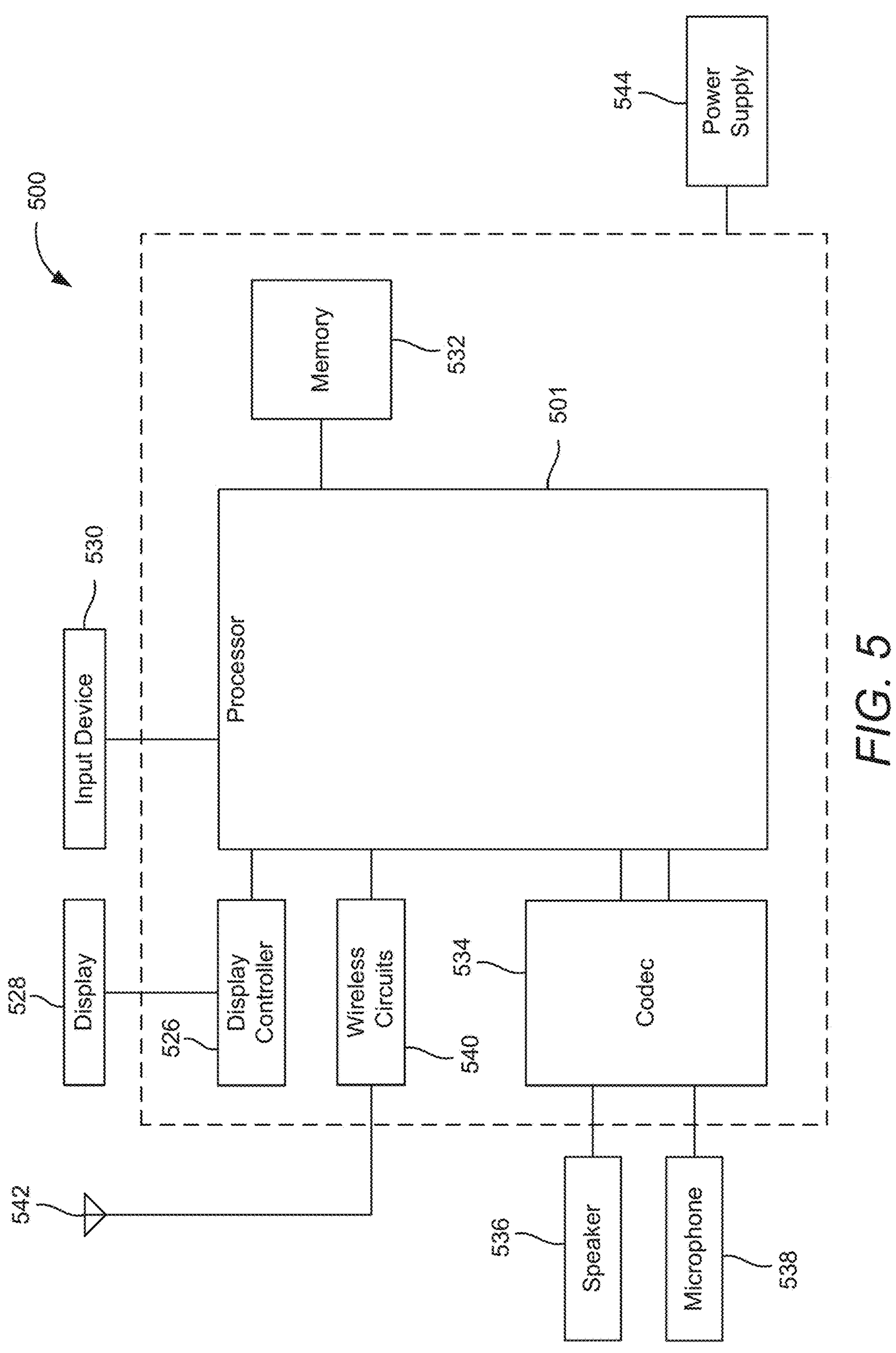
FIG. 5 illustrates a mobile device, according to aspects of the disclosure.

FIG. 5 illustrates a mobile device 500, according to aspects of the disclosure. In some aspects, the mobile device 500 may be implemented by including one or more IC devices that include interposers as disclosed herein.

In some aspects, mobile device 500 may be configured as a wireless communication device. As shown, mobile device 500 includes processor 501. Processor 501 may be communicatively coupled to memory 532 over a link, which may be a die-to-die or chip-to-chip link. Mobile device 500 also includes display 528 and display controller 526, with display controller 526 coupled to processor 501 and to display 528. The mobile device 500 may include input device 530 (e.g., physical, or virtual keyboard), power supply 544 (e.g., battery), speaker 536, microphone 538, and wireless antenna 542. In some aspects, the power supply 544 may directly or indirectly provide the supply voltage for operating some or all of the components of the mobile device 500.

In some aspects, FIG. 5 may include coder/decoder (CODEC) 534 (e.g., an audio and/or voice CODEC) coupled to processor 501; speaker 536 and microphone 538 coupled to CODEC 534; and wireless circuits 540 (which may include a modem, RF circuitry, filters, etc.) coupled to wireless antenna 542 and to processor 501.

In some aspects, one or more of processor 501 (e.g., SoCs, application processor (AP)), display controller 526, memory 532, CODEC 534, and wireless circuits 540 (e.g., baseband interface) including IC devices that are packaged as IC packages and including interposers according to the various aspects described in this disclosure.

It should be noted that although FIG. 5 depicts a mobile device 500, similar architecture may be used to implement an apparatus including a set top box, a music player, a video player, an entertainment unit, a navigation device, a personal digital assistant (PDA), a fixed location data unit, a computer, a laptop, a tablet, a communications device, a mobile phone, or other similar devices.

Figure 6:
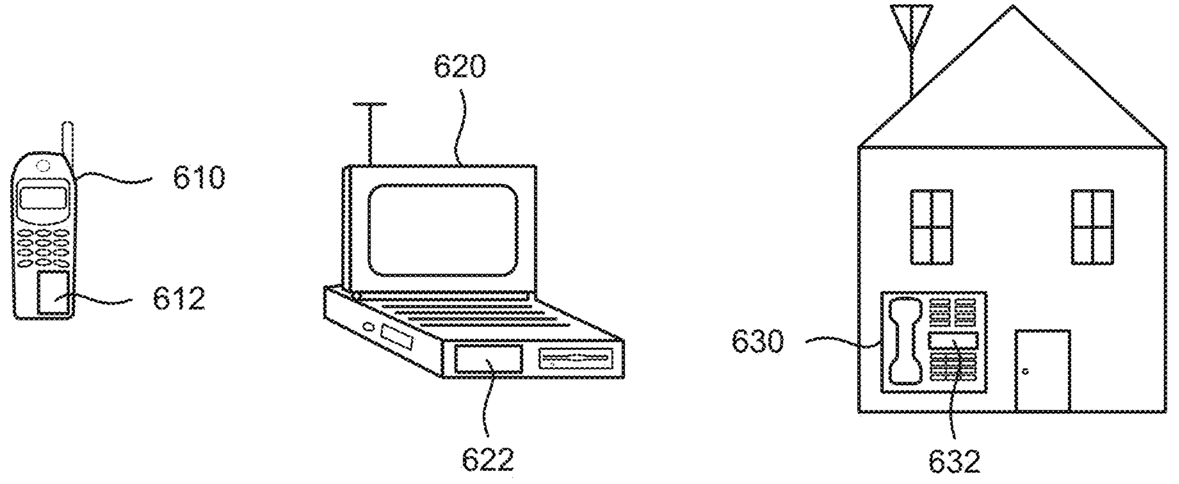
FIG. 6 illustrates various electronic devices that may incorporate IC devices being put into the IC packages that include interposers as described herein, according to aspects of the disclosure.

FIG. 6 illustrates various electronic devices 610, 620, and 630 that may incorporate IC devices 612, 622, and 632, which may be packaged as IC packages that include interposers as described herein, according to aspects of the disclosure.

For example, a mobile phone device 610, a laptop computer device 620, and a fixed location terminal device 630 may each be considered generally user equipment (UE) and may include one or more IC devices, such as IC devices 612, 622, and 632, and a power supply to provide the supply voltages to power the IC devices. The IC devices 612, 622, and 632 may be, for example, correspond to an IC device packaged as an IC package having an interposer manufactured based on the examples described above with reference to FIGS. 2 and 3A-3E.

The devices 610, 620, and 630 illustrated in FIG. 6 are merely non-limiting examples. Other electronic devices may also feature the IC devices including interposers as described in this disclosure, including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device, an access point, a base station, or any other device that stores or retrieves data or computer instructions or any combination thereof.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-6 may be rearranged and/or combined into a single component, process, feature, or function or incorporated in several components, processes, or functions. Additional elements, components, processes, and/or functions may also be added without departing from the disclosure. In some implementations, FIGS. 1-6 and the corresponding description may be used to manufacture, create, provide, and/or produce integrated devices. In some implementations, a device may include a die, an integrated device, a die package, an IC, a device package, an IC package, a wafer, a semiconductor device, a system in package (SiP), a system on chip (SoC), a package on package (POP) device, and the like.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. An interposer, comprising: a substrate; a first metallization layer on the substrate, the first metallization layer having a first plurality of conductive patterns; a second metallization layer having a second plurality of conductive patterns; and a via layer disposed between the first metallization layer and the second metallization layer, the via layer having a plurality of vias, wherein: at least a portion of the first plurality of conductive patterns, a portion of the second plurality of conductive patterns, or both are configured to form a first inductor device and a second inductor device, the first inductor device is electrically coupled between a first power node and a second power node of the interposer, and the second inductor device is electrically coupled between the first power node and a third power node of the interposer.

Clause 2. The interposer of clause 1, wherein: the first inductor device comprises: a first spiral structure formed in the first metallization layer or the second metallization layer; or a first solenoid structure formed in the first metallization layer, the via layer, and the second metallization layer, and the second inductor device comprises: a second spiral structure formed in the first metallization layer or the second metallization layer; or a second solenoid structure formed in the first metallization layer, the via layer, and the second metallization layer.

Clause 3. The interposer of any of clauses 1 to 2, further comprising: a first capacitor device and a second capacitor device formed in the substrate, the first metallization layer, the via layer, the second metallization layer, or a combination thereof, the first capacitor device is electrically coupled between the second power node and a fourth power node of the interposer, and the second capacitor device is electrically coupled between the third power node and a fifth power node of the interposer.

Clause 4. The interposer of clause 3, wherein: the first capacitor device comprises: a first metal-insulator-metal structure formed in the first metallization layer and the via layer; a first metal-oxide-metal structure formed in the first metallization layer, the second metallization layer, or both; or a first deep trench capacitor structure formed in the first metallization layer and the substrate; and the second capacitor device comprises: a second metal-insulator-metal structure formed in the first metallization layer and the via layer; a second metal-oxide-metal structure formed in the first metallization layer, the second metallization layer, or both; or a second deep trench capacitor structure formed in the first metallization layer and the substrate.

Clause 5. The interposer of any of clauses 3 to 4, wherein: the first power node is configured to carry a first supply voltage; and the fourth power node and the fifth power node are configured to carry a second supply voltage that is different from the first supply voltage or to carry a ground voltage.

Clause 6. The interposer of any of clauses 1 to 5, wherein: the first power node, the second power node, and the third power node are configured for a same direct current (DC) electric potential.

Clause 7. A method of manufacturing an interposer, comprising: forming a first metallization layer on a substrate, the first metallization layer having a first plurality of conductive patterns; forming a second metallization layer having a second plurality of conductive patterns; and forming a via layer disposed between the first metallization layer and the second metallization layer, the via layer having a plurality of vias, wherein: at least a portion of the first plurality of conductive patterns, a portion of the second plurality of conductive patterns, or both are configured to form a first inductor device and a second inductor device, the first inductor device is electrically coupled between a first power node and a second power node of the interposer, and the second inductor device is electrically coupled between the first power node and a third power node of the interposer.

Clause 8. The method of clause 7, wherein: the first inductor device comprises: a first spiral structure formed in the first metallization layer or the second metallization layer; or a first solenoid structure formed in the first metallization layer, the via layer, and the second metallization layer, and the second inductor device comprises: a second spiral structure formed in the first metallization layer or the second metallization layer; or a second solenoid structure formed in the first metallization layer, the via layer, and the second metallization layer.

Clause 9. The method of any of clauses 7 to 8, wherein: a first capacitor device and a second capacitor device are formed in the substrate, the first metallization layer, the via layer, the second metallization layer, or a combination thereof, the first capacitor device is electrically coupled between the second power node and a fourth power node of the interposer, and the second capacitor device is electrically coupled between the third power node and a fifth power node of the interposer.

Clause 10. The method of clause 9, wherein: the first capacitor device comprises a first metal-insulator-metal structure formed in the first metallization layer and the via layer, the forming the first metallization layer comprises forming a first metal portion of the first metal-insulator-metal structure, and the forming the via layer comprises forming an insulator portion of the first metal-insulator-metal structure on the first metal portion and forming a second metal portion on the insulator portion.

Clause 11. The method of clause 9, wherein: the first capacitor device comprises a first metal-oxide-metal structure formed in the first metallization layer, the second metallization layer, or both, and one or both of: the forming the first metallization layer comprises forming a first metal portion of the first metal-oxide-metal structure, a second metal portion of the first metal-oxide-metal structure, and a first insulator portion separating the first metal portion and the second metal portion, or the forming the second metallization layer comprises forming a third metal portion of the first metal-oxide-metal structure, a fourth metal portion of the first metal-oxide-metal structure, and a second insulator portion separating the third metal portion and the fourth metal portion.

Clause 12. The method of clause 9, wherein: the first capacitor device comprises a first deep trench capacitor structure formed in the first metallization layer and the substrate, the method further comprises: forming trenches in the substrate; forming a first metal portion of the first deep trench capacitor structure in the trenches and extending to an upper surface of the substrate; forming an insulator portion of the first deep trench capacitor structure in the trenches and on the first metal portion; forming a second metal portion of the first deep trench capacitor structure in the trenches and on the insulator portion, the first metal portion, the insulator portion, and the second metal portion are at least partially in the first metallization layer and partially in the substrate.

Clause 13. The method of any of clauses 9 to 12, wherein: the first power node is configured to carry a first supply voltage; and the fourth power node and the fifth power node are configured to carry a second supply voltage that is different from the first supply voltage or to carry a ground voltage.

Clause 14. The method of any of clauses 7 to 13, wherein: the first power node, the second power node, and the third power node are configured for a same direct current (DC) electric potential.

Clause 15. An integrated circuit (IC) package, comprising: an interposer comprising: a substrate; a first metallization layer on the substrate, the first metallization layer having a first plurality of conductive patterns; a second metallization layer having a second plurality of conductive patterns; and a via layer disposed between the first metallization layer and the second metallization layer, the via layer having a plurality of vias, a first IC die mounted on the interposer, the first IC die including a first circuit block and a second circuit block, wherein at least a portion of the first plurality of conductive patterns, a portion of the second plurality of conductive patterns, or both are configured to form a first inductor device and a second inductor device, the first inductor device is electrically coupled between a first power node and a second power node of the interposer, the second inductor device is electrically coupled between the first power node and a third power node of the interposer, the first circuit block includes a first power terminal electrically coupled to the second power node of the interposer, and the second circuit block includes a second power node electrically coupled to the third power node of the interposer.

Clause 16. The IC package of clause 15, wherein: the first inductor device comprises: a first spiral inductor having a first spiral structure formed in the first metallization layer or the second metallization layer; or a first solenoid structure having first conductive patterns in the first metallization layer, first vias in the via layer, and second conductive patterns in the second metallization layer connected as a coil winding of the first solenoid structure, and the second inductor device comprises: a second spiral inductor having a second spiral structure formed in the first metallization layer or the second metallization layer; or a second solenoid structure having third conductive patterns in the first metallization layer, second vias in the via layer, and fourth conductive patterns in the second metallization layer connected as a coil winding of the second solenoid structure.

Clause 17. The IC package of any of clauses 15 to 16, wherein: a first capacitor device and a second capacitor device are formed in the substrate, the first metallization layer, the via layer, the second metallization layer, or a combination thereof, of the interposer, the first capacitor device is electrically coupled between the second power node and a fourth power node of the interposer, the second capacitor device is electrically coupled between the third power node and a fifth power node of the interposer, the first circuit block includes a third power terminal electrically coupled to the fourth power node of the interposer, and the second circuit block includes a fourth power node electrically coupled to the fifth power node of the interposer.

Clause 18. The IC package of clause 17, wherein: the first capacitor device comprises: a first metal-insulator-metal structure formed in the first metallization layer and the via layer; a first metal-oxide-metal structure formed in the first metallization layer, the second metallization layer, or both; or a first deep trench capacitor structure formed in the first metallization layer and the substrate; and the second capacitor device comprises: a second metal-insulator-metal structure formed in the first metallization layer and the via layer; a second metal-oxide-metal structure formed in the first metallization layer, the second metallization layer, or both; or a second deep trench capacitor structure formed in the first metallization layer and the substrate.

Clause 19. The IC package of any of clauses 17 to 18, wherein: the first power node is configured to carry a first supply voltage; and the fourth power node and the fifth power node are configured to carry a second supply voltage that is different from the first supply voltage or to carry a ground voltage.

Clause 20. The IC package of any of clauses 17 to 19, further comprising: a second IC die, the interposer being mounted on the second IC die, wherein: the interposer comprises a first set of conductive structures forming the first power node, a second set of conductive structures forming the fourth power node, and a third set of conductive structures forming the fifth power node, and the second IC die comprises: a first through-substrate via (TSV) electrically coupled to the first set of conductive structures; a second TSV electrically coupled to the second set of conductive structures; and a third TSV electrically coupled to the third set of conductive structures.

Clause 21. The IC package of any of clauses 15 to 20, wherein: the first power node, the second power node, and the third power node are configured for a same direct current (DC) electric potential.

Clause 22. An electronic device, comprising: an integrated circuit (IC) package that comprises: an interposer comprising: a substrate; a first metallization layer on the substrate, the first metallization layer having a first plurality of conductive patterns; a second metallization layer having a second plurality of conductive patterns; and a via layer disposed between the first metallization layer and the second metallization layer, the via layer having a plurality of vias, a first IC die mounted on the interposer, the first IC die including a first circuit block and a second circuit block, wherein at least a portion of the first plurality of conductive patterns, a portion of the second plurality of conductive patterns, or both are configured to form a first inductor device and a second inductor device, the first inductor device is electrically coupled between a first power node and a second power node of the interposer, the second inductor device is electrically coupled between the first power node and a third power node of the interposer, the first circuit block includes a first power terminal electrically coupled to the second power node of the interposer, and the second circuit block includes a second power node electrically coupled to the third power node of the interposer.

Clause 23. The electronic device of clause 22, wherein: the first inductor device comprises: a first spiral inductor having a first spiral structure formed in the first metallization layer or the second metallization layer; or a first solenoid structure having first conductive patterns in the first metallization layer, first vias in the via layer, and second conductive patterns in the second metallization layer connected as a coil winding of the first solenoid structure, and the second inductor device comprises: a second spiral inductor having a second spiral structure formed in the first metallization layer or the second metallization layer; or a second solenoid structure having third conductive patterns in the first metallization layer, second vias in the via layer, and fourth conductive patterns in the second metallization layer connected as a coil winding of the second solenoid structure.

Clause 24. The electronic device of any of clauses 22 to 23, wherein: a first capacitor device and a second capacitor device are formed in the substrate, the first metallization layer, the via layer, the second metallization layer, or a combination thereof, of the interposer, the first capacitor device is electrically coupled between the second power node and a fourth power node of the interposer, the second capacitor device is electrically coupled between the third power node and a fifth power node of the interposer, the first circuit block having a third power terminal electrically coupled to the fourth power node of the interposer, and the second circuit block having a fourth power node electrically coupled to the fifth power node of the interposer.

Clause 25. The electronic device of clause 24, wherein: the first capacitor device comprises: a first metal-insulator-metal structure formed in the first metallization layer and the via layer; a first metal-oxide-metal structure formed in the first metallization layer, the second metallization layer, or both; or a first deep trench capacitor structure formed in the first metallization layer and the substrate; and the second capacitor device comprises: a second metal-insulator-metal structure formed in the first metallization layer and the via layer; a second metal-oxide-metal structure formed in the first metallization layer, the second metallization layer, or both; or a second deep trench capacitor structure formed in the first metallization layer and the substrate.

Clause 26. The electronic device of any of clauses 24 to 25, wherein: the first power node is configured to carry a first supply voltage; and the fourth power node and the fifth power node are configured to carry a second supply voltage that is different from the first supply voltage or to carry a ground voltage.

Clause 27. The electronic device of any of clauses 24 to 26, wherein the IC package further comprises: a second IC die, the interposer being mounted on the second IC die, wherein: the interposer comprises a first set of conductive structures forming the first power node, a second set of conductive structures forming the fourth power node, and a third set of conductive structures forming the fifth power node, and the second IC die comprises: a first through-substrate via (TSV) electrically coupled to the first set of conductive structures; a second TSV electrically coupled to the second set of conductive structures; and a third TSV electrically coupled to the third set of conductive structures.

Clause 28. The electronic device of any of clauses 22 to 27, wherein: the first power node, the second power node, and the third power node are configured for a same direct current (DC) electric potential.

Clause 29. The electronic device of any of clauses 22 to 28, wherein the electronic device comprises at least one of: a music player, a video player, an entertainment unit; a navigation device, a communications device, a mobile device, a mobile phone, a smartphone, a personal digital assistant, a fixed location terminal, a tablet computer, a computer, a wearable device, a laptop computer, a server, an internet of things (IoT) device, or a device in an automotive vehicle.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a DSP, an ASIC, an FPGA, or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Furthermore, as used herein, the terms "set," "group," and the like are intended to include one or more of the stated elements. Also, as used herein, the terms "has," "have," "having," "comprises," "comprising," "includes," "including," and the like does not preclude the presence of one or more additional elements (e.g., an element "having" A may also have B). Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of") or the alternatives are mutually exclusive (e.g., "one or more" should not be interpreted as "one and more"). Furthermore, although components, functions, actions, and instructions may be described or claimed in the singular, the plural is contemplated unless limitation to the singular is explicitly stated. Accordingly, as used herein, the articles "a," "an," "the," and "said" are intended to include one or more of the stated elements. Additionally, as used herein, the terms "at least one" and "one or more" encompass "one" component, function, action, or instruction performing or capable of performing a described or claimed functionality and also "two or more" components, functions, actions, or instructions performing or capable of performing a described or claimed functionality in combination.

While the foregoing disclosure shows illustrative aspects of the disclosure, it should be noted that various changes and modifications could be made herein without departing from the scope of the disclosure as defined by the appended claims. For example, the functions, steps and/or actions of the method claims in accordance with the aspects of the disclosure described herein need not be performed in any particular order. Further, no component, function, action, or instruction described or claimed herein should be construed as critical or essential unless explicitly described as such.

What is claimed is:

1. An interposer, comprising:
a substrate;
a first metallization layer on the substrate, the first metallization layer having a first plurality of conductive patterns;
a second metallization layer having a second plurality of conductive patterns; and
a via layer disposed between the first metallization layer and the second metallization layer, the via layer having a plurality of vias,
wherein:
at least a portion of the first plurality of conductive patterns, a portion of the second plurality of conductive patterns, or both are configured to form a first inductor device and a second inductor device,
the first inductor device is electrically coupled between a first power node and a second power node of the interposer, and
the second inductor device is electrically coupled between the first power node and a third power node of the interposer.

2. The interposer of claim 1, wherein:
the first inductor device comprises:
a first spiral structure formed in the first metallization layer or the second metallization layer; or
a first solenoid structure formed in the first metallization layer, the via layer, and the second metallization layer, and
the second inductor device comprises:
a second spiral structure formed in the first metallization layer or the second metallization layer; or
a second solenoid structure formed in the first metallization layer, the via layer, and the second metallization layer.

3. The interposer of claim 1, further comprising:
a first capacitor device and a second capacitor device formed in the substrate, the first metallization layer, the via layer, the second metallization layer, or a combination thereof,
the first capacitor device is electrically coupled between the second power node and a fourth power node of the interposer, and
the second capacitor device is electrically coupled between the third power node and a fifth power node of the interposer.

4. The interposer of claim 3, wherein:
the first capacitor device comprises:
a first metal-insulator-metal structure formed in the first metallization layer and the via layer;
a first metal-oxide-metal structure formed in the first metallization layer, the second metallization layer, or both; or
a first deep trench capacitor structure formed in the first metallization layer and the substrate; and
the second capacitor device comprises:
a second metal-insulator-metal structure formed in the first metallization layer and the via layer;
a second metal-oxide-metal structure formed in the first metallization layer, the second metallization layer, or both; or
a second deep trench capacitor structure formed in the first metallization layer and the substrate.

5. The interposer of claim 3, wherein:
the first power node is configured to carry a first supply voltage; and
the fourth power node and the fifth power node are configured to carry a second supply voltage that is different from the first supply voltage or to carry a ground voltage.

6. The interposer of claim 1, wherein:
the first power node, the second power node, and the third power node are configured for a same direct current (DC) electric potential.

7. A method of manufacturing an interposer, comprising:
forming a first metallization layer on a substrate, the first metallization layer having a first plurality of conductive patterns;
forming a second metallization layer having a second plurality of conductive patterns; and
forming a via layer disposed between the first metallization layer and the second metallization layer, the via layer having a plurality of vias,
wherein:
at least a portion of the first plurality of conductive patterns, a portion of the second plurality of conductive patterns, or both are configured to form a first inductor device and a second inductor device,
the first inductor device is electrically coupled between a first power node and a second power node of the interposer, and the second inductor device is electrically coupled between the first power node and a third power node of the interposer.

8. The method of claim 7, wherein:

the first inductor device comprises:

a first spiral structure formed in the first metallization layer or the second metallization layer; or a first solenoid structure formed in the first metallization layer, the via layer, and the second metallization layer, and the second inductor device comprises:

a second spiral structure formed in the first metallization layer or the second metallization layer; or a second solenoid structure formed in the first metallization layer, the via layer, and the second metallization layer.

9. The method of claim 7, wherein:

a first capacitor device and a second capacitor device are formed in the substrate, the first metallization layer, the via layer, the second metallization layer, or a combination thereof, the first capacitor device is electrically coupled between the second power node and a fourth power node of the interposer, and the second capacitor device is electrically coupled between the third power node and a fifth power node of the interposer.

10. The method of claim 9, wherein:

the first capacitor device comprises a first metal-insulator-metal structure formed in the first metallization layer and the via layer, the forming the first metallization layer comprises forming a first metal portion of the first metal-insulator-metal structure, and the forming the via layer comprises forming an insulator portion of the first metal-insulator-metal structure on the first metal portion and forming a second metal portion on the insulator portion.

11. The method of claim 9, wherein:

the first capacitor device comprises a first metal-oxide-metal structure formed in the first metallization layer, the second metallization layer, or both, and one or both of:

the forming the first metallization layer comprises forming a first metal portion of the first metal-oxide-metal structure, a second metal portion of the first metal-oxide-metal structure, and a first insulator portion separating the first metal portion and the second metal portion, or the forming the second metallization layer comprises forming a third metal portion of the first metal-oxide-metal structure, a fourth metal portion of the first metal-oxide-metal structure, and a second insulator portion separating the third metal portion and the fourth metal portion.

12. The method of claim 9, wherein:

the first capacitor device comprises a first deep trench capacitor structure formed in the first metallization layer and the substrate, the method further comprises:

forming trenches in the substrate;

forming a first metal portion of the first deep trench capacitor structure in the trenches and extending to an upper surface of the substrate;

forming an insulator portion of the first deep trench capacitor structure in the trenches and on the first metal portion;

forming a second metal portion of the first deep trench capacitor structure in the trenches and on the insulator portion, the first metal portion, the insulator portion, and the second metal portion are at least partially in the first metallization layer and partially in the substrate.

13. The method of claim 9, wherein:

the first power node is configured to carry a first supply voltage; and the fourth power node and the fifth power node are configured to carry a second supply voltage that is different from the first supply voltage or to carry a ground voltage.

14. An integrated circuit (IC) package, comprising:

an interposer comprising:

a substrate;

a first metallization layer on the substrate, the first metallization layer having a first plurality of conductive patterns;

a second metallization layer having a second plurality of conductive patterns; and a via layer disposed between the first metallization layer and the second metallization layer, the via layer having a plurality of vias, a first IC die mounted on the interposer, the first IC die including a first circuit block and a second circuit block, wherein at least a portion of the first plurality of conductive patterns, a portion of the second plurality of conductive patterns, or both are configured to form a first inductor device and a second inductor device, the first inductor device is electrically coupled between a first power node and a second power node of the interposer, the second inductor device is electrically coupled between the first power node and a third power node of the interposer, the first circuit block includes a first power terminal electrically coupled to the second power node of the interposer, and the second circuit block includes a second power node electrically coupled to the third power node of the interposer.

15. The IC package of claim 14, wherein:

the first inductor device comprises:

a first spiral inductor having a first spiral structure formed in the first metallization layer or the second metallization layer; or a first solenoid structure having first conductive patterns in the first metallization layer, first vias in the via layer, and second conductive patterns in the second metallization layer connected as a coil winding of the first solenoid structure, and the second inductor device comprises:

a second spiral inductor having a second spiral structure formed in the first metallization layer or the second metallization layer; or a second solenoid structure having third conductive patterns in the first metallization layer, second vias in the via layer, and fourth conductive patterns in the second metallization layer connected as a coil winding of the second solenoid structure.

16. The IC package of claim 14, wherein:

a first capacitor device and a second capacitor device are formed in the substrate, the first metallization layer, the via layer, the second metallization layer, or a combination thereof, of the interposer, the first capacitor device is electrically coupled between the second power node and a fourth power node of the interposer, the second capacitor device is electrically coupled between the third power node and a fifth power node of the interposer, the first circuit block includes a third power terminal electrically coupled to the fourth power node of the interposer, and the second circuit block includes a fourth power node electrically coupled to the fifth power node of the interposer.

17. The IC package of claim 16, wherein:

the first capacitor device comprises:

a first metal-insulator-metal structure formed in the first metallization layer and the via layer;

a first metal-oxide-metal structure formed in the first metallization layer, the second metallization layer, or both; or a first deep trench capacitor structure formed in the first metallization layer and the substrate; and the second capacitor device comprises:

a second metal-insulator-metal structure formed in the first metallization layer and the via layer;

a second metal-oxide-metal structure formed in the first metallization layer, the second metallization layer, or both; or a second deep trench capacitor structure formed in the first metallization layer and the substrate.

18. The IC package of claim 16, wherein:

the first power node is configured to carry a first supply voltage; and the fourth power node and the fifth power node are configured to carry a second supply voltage that is different from the first supply voltage or to carry a ground voltage.

19. The IC package of claim 16, further comprising:

a second IC die, the interposer being mounted on the second IC die, wherein:

the interposer comprises a first set of conductive structures forming the first power node, a second set of conductive structures forming the fourth power node, and a third set of conductive structures forming the fifth power node, and the second IC die comprises:

a first through-substrate via (TSV) electrically coupled to the first set of conductive structures;

a second TSV electrically coupled to the second set of conductive structures; and a third TSV electrically coupled to the third set of conductive structures.

20. The IC package of claim 14, wherein:

the first power node, the second power node, and the third power node are configured for a same direct current (DC) electric potential.

* * * * *